United States Patent [19]

Andricacos et al.

[11] Patent Number: 5,352,350

[45] Date of Patent: Oct. 4, 1994

[54] METHOD FOR CONTROLLING CHEMICAL SPECIES CONCENTRATION

[75] Inventors: Panayotis C. Andricacos, Croton-on-Hudson; John O. Dukovic, Pleasantville; Lubomyr T. Romankiw, Briarcliff Manor, all of N.Y.

[73] Assignee: International Business Machines Corporation, Armonk, N.Y.

[21] Appl. No.: 837,468

[22] Filed: Feb. 14, 1992

[51] Int. Cl.[5] .................. C25D 21/14; C25D 21/18; C25D 21/20

[52] U.S. Cl. .................. 205/101; 204/106; 204/123; 204/129.1; 156/642; 427/437; 427/443.1

[58] Field of Search ............ 204/106, 123, 238, 129.1; 205/101; 156/642; 427/443.1, 437

[56] References Cited

U.S. PATENT DOCUMENTS

| | | | |
|---|---|---|---|
| 3,649,509 | 3/1972 | Morawetz et al. | 204/238 |
| 3,674,672 | 7/1972 | Whitesell | 204/195 R |
| 4,045,304 | 8/1977 | Tezuka | 205/101 |
| 4,055,751 | 10/1977 | Bussmann et al. | 364/500 |
| 4,146,437 | 3/1979 | O'Keefe | 204/1.11 |
| 4,286,965 | 9/1981 | Vanhumbeeck et al. | 23/230 A |
| 4,315,518 | 2/1982 | Sawyer | 137/3 |
| 4,326,940 | 4/1982 | Eckles et al. | 204/232 |
| 4,648,043 | 3/1987 | O'Leary | 210/143 X |
| 4,659,459 | 4/1987 | O'Leary et al. | 210/143 X |
| 4,774,101 | 9/1988 | Harris et al. | 427/8 |
| 4,814,197 | 3/1989 | Duffy et al. | 427/8 |
| 4,886,590 | 12/1989 | Tittle | 204/232 |
| 4,967,690 | 11/1990 | Fey et al. | 118/429 |

*Primary Examiner*—Donald R. Valentine
*Attorney, Agent, or Firm*—Louis J. Percello

[57] ABSTRACT

A method is described for maintaining constant chemical composition in solutions used for wet chemical processing. All chemical species that are deliberately included in the bath are kept at constant concentration primarily by a method of compensating for their depletion or generation with a set of feed solutions that are formulated and dosed into the bath in accordance with an overall material balance. Further, all chemical species not deliberately included in the bath are kept at constant concentration primarily by keeping the aggregate volume of replenishing stocks in strict proportion to the process service performed by the bath (e.g. the charge passed in an electroplating cell). Finally, a time-based scheme completes the control of the concentration of all bath species by controlling any species (whether deliberately included in the bath or not) that is depleted or generated as the result of chemical reactions which occur independently and/or spontaneously with time. Maintaining all bath chemical species at constant concentration prevents bath aging and permits production of more uniform work pieces from the bath.

23 Claims, 4 Drawing Sheets

| | PROCESS-ACTIVE | | NON-PROCESS-ACTIVE |
|---|---|---|---|
| | RAPID | GRADUAL | |
| DELIBERATE | D-P$_R$ | D-P$_G$ | D-nonP |
| | \multicolumn{3}{c}{NON - TIME - ACTIVE} | |
| | \multicolumn{3}{c}{TIME - ACTIVE} | |
| | D-P$_R$-T | D-P$_G$-T | D-nonP-T |
| NON-DELIBERATE | nonD-P-T | | nonD-nonP-T |
| | nonD-P | | nonD nonP |

FIG. 1

| | PROCESS-ACTIVE | | NON-PROCESS-ACTIVE |
|---|---|---|---|
| | RAPID | GRADUAL | |
| DELIBERATE | D-P$_R$ | D-P$_G$ | D-nonP |
| | NON – TIME – ACTIVE | | |
| | TIME – ACTIVE | | |
| | D-P$_R$-T | D-P$_G$-T | D-nonP-T |
| NON-DELIBERATE | nonD-P-T | | nonD-nonP-T |
| | nonD-P | | nonD nonP |

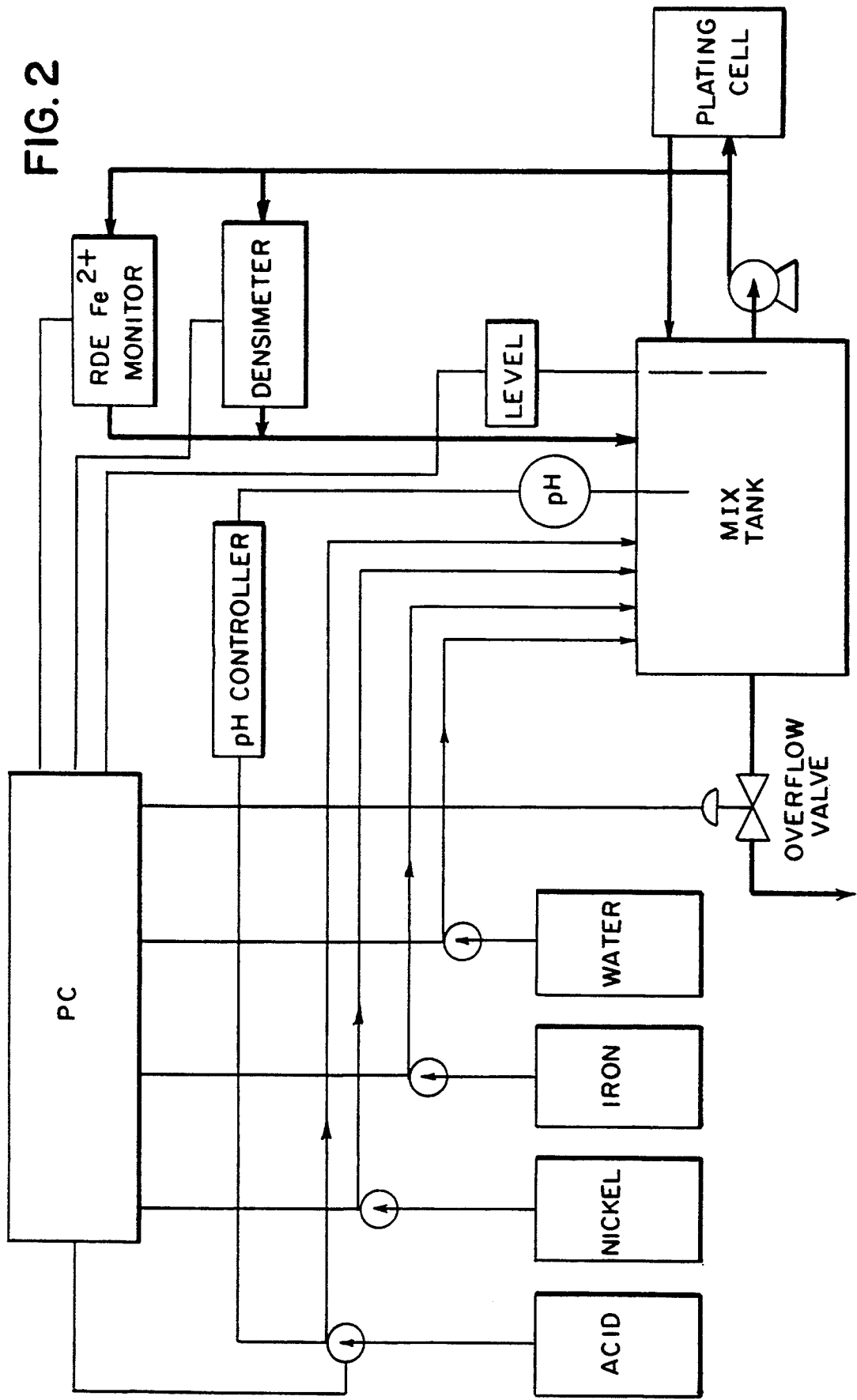

FIG. 3A

Table of Symbols

| Symbol | Definition |
|---|---|
| $c_i$ | concentration of species $i$ in the bath (mole/l) |
| $\Delta c_i$ | change in concentration of species $i$ in bath (mole/l) |
| $c_i^{CORR}$ | concentration of species $i$ in correcting feed (mole/l) |
| $c_{i,j}$ | concentration of species $i$ in feed $j$ (mole/l) |
| $c_i^{MEAS}$ | measured concentration of species $i$ in bath (mole/l) |
| $c_i^t$ | target concentration of species $i$ in bath (mole/l) |
| $D$ | abbreviation for deliberate |
| $F$ | Faraday's constant, 26.8 A-hr/equivalent |
| $K$ | service-linked volume exchange rate (liter/service-unit) |
| $k_i$ | apparent stoichiometric coefficient for species $i$ (mole/service-unit) |
| $n_F$ | number of regular feed solutions used in SPD |
| $n_{TOT}$ | total number of feed solutions used in SPD and ABC |
| $nonD$ | abbreviation for non-deliberate |
| $nonP$ | abbreviation for non-process-active |
| $nonT$ | abbreviation for non-time-active |
| $pace$ | pace of processing (service units per bath volume, eg A-hr/l) |
| $P$ | abbreviation for process-active |
| $S$ | process service (in "service units," eg. A-hr) |
| $\Delta S$ | amount of process service delivered in a time interval (service units) |
| $\Delta S_{SINCE}$ | process service delivered since last tuning (service units) |
| $s$ | service density (service units per unit volume, eg. A-hr/l) |
| $\Delta s$ | change in service density during a time interval (service units per unit v |
| $\Delta t$ | time interval (hr) |
| $T$ | abbreviation for time-active |
| $u_j$ | fraction of total feed volume due to feed j (dimensionless) |
| $V$ | volume of bath (liter) |

FIG. 3B

| | |
|---|---|
| $\Delta V$ | volume (of a given solution) added to the bath (liter) |
| $\Delta V^{CORR}$ | volume of correcting feed added to bath (l) |
| $\Delta V_{SOLV}$ | volume of solvent added to bath (l) |
| $\Delta V_j$ | volume of stock solution $j$ dispensed in time interval $\Delta t$ (liter) |
| $\Delta V_j^{SINCE}$ | volume of feed j dispensed since last tuning (l) |
| $\Delta V_{TOT}^{SINCE}$ | total volume of feeds dispensed since last tuning (l) |
| $\Delta V_{TOT}$ | combined volume of feed dispensed in the time interval $\Delta t$ (liter) |
| $\rho^o$ | target bath density (g/cm$^3$) |
| $\rho^{H_2O}$ | density of pure water (g/cm$^3$) |
| $\rho^{MEAS}$ | measured bath density (g/cm$^3$) |
| $\theta$ | relaxation factor in ABT equation |

Subscripts and superscripts

| | |
|---|---|
| $AS$ | acid stock (in Example 1) |
| $AVE$ | average value over an interval of time |
| $CORR$ | pertaining to a correcting stock solution |
| $i$ | index of chemical species in bath |
| $I$ | indicating species |
| $IS$ | iron stock (in Example 1) |
| $j$ | index of feed stock solutions |
| $MEAS$ | value obtained by direct measurement |
| $NEW$ | value determined by the present calculation |
| $NS$ | nickel stock (in Example 1) |
| $o$ | pertaining to a bath at its target composition |
| $OLD$ | value in use until the present calculation |
| $SINCE$ | cumulative value since the last tuning |
| $SOLV$ | pertaining to the solvent |
| $TGT$ | target value |
| $TOT$ | total |

METHOD FOR CONTROLLING CHEMICAL SPECIES CONCENTRATION

BACKGROUND OF THE INVENTION

1. Field of the Invention

The present invention relates generally to the field of wet chemical baths used in processes for treating workpieces, for example, plating processes. In particular, the present invention relates to automatic analysis and control of concentrations of chemicals in bath solutions so that the concentration of all bath chemicals remains constant throughout the entire bath process.

2. Description of the Prior Art

Chemical baths are solutions, normally but not necessarily aqueous, which contain one or more chemicals, hereinafter called chemical species. These chemical species exist in certain concentrations in the solution. Some of these species interact or chemically react with a material, called a workpiece, which is placed in the bath. Examples of such chemical baths or "wet processes" are electroplating, electroless deposition, chemical and electrochemical etching, pickling, adhesion promotion, seeding (deposition of a thin catalytic layer on a workpiece), photographic and lithographic developing, and rinsing. Most of these baths interact with the workpiece to produce changes in the workpiece surface, e.g., addition of a film on the workpiece surface or removal of some of all of the initial workpiece surface.

While the chemical bath and the workpiece are interacting, both the bath and the workpiece change. Chemical species may leave the bath, i.e., the species is depleted from the bath, to deposit or plate on to the workpiece. Alternatively, a chemical species may be removed (e.g. etched) from the workpiece and enter, or accumulate in the bath. Other ways chemical species deplete or accumulate in a bath are discussed below. As the bath changes due to the accumulation and/or depletion of these species, the bath is said to "age."

In most industries, including the electronics industry, a majority of such processes are operated in the batch mode, i.e., one bath solution is used at a time. These batch processes often have a simple control scheme that replenishes one or even several of the depleted or consumed chemical species. Replenishment is used to keep the bath concentration of the depleted species from decreasing. In other words, the control scheme tries to prevent the bath from aging (changing) by replacing the depleted amounts of some consumed species.

Because the prior art has not accounted for all the species that deplete or accumulate in these wet processes, the baths controlled by the prior art age both as they are used and as time passes. As a result, the performance (i.e., the affect on the workpiece) of prior art baths changes and finally degrades to an unsatisfactory point. Furthermore, as the bath is degrading, the produced workpieces become more nonuniform and eventually fall outside of their required specifications. Ultimately, these baths are discarded and replaced with a fresh bath solution.

The prior art has various approaches to monitor and/or to control chemical baths but teaches substantially the same general method.

First one or more measurements of the bath are made. These measurements, taken manually or automatically, can be "off-line" measurements of a bath sample or "in-line" or "on-line" measurements taken as the bath is working.

The sample then may be treated in some manner to place the sample in a condition for the next step, i.e., analysis. This treatment might include the addition of solvents, water, acid, or metal ion to the sample.

The treated sample may be analyzed for one or a plurality of chemical species using one step or a sequence of steps. Analyzers, using chromatography, titration, spectrophotometry, electrochemical sensors or other equipment or techniques, develop signals that relate to the actual concentrations of each analyzed chemical species in the bath. Note that analysis and signal development can be done for other bath characteristics, called parameters, which include bath temperature, pH, level (volume), specific gravity and plating (process service) electrical current.

The actual chemical species concentration signals or bath parameter signals are then compared to their respective target value. The amount of species replenishment or other corrective action depends on the difference, or error, between the measured and target values.

The prior art teaches a number of corrective actions that are based on comparison between a measured value and a target value. One process takes action when established limits are exceeded. Some processes set up a ratio or a certain "quality index" as a reference. Still another process uses an "adjustable rated value" as a reference. An additional process takes action when bath components fall outside a standard concentration range. A different process adds make-up solutions when the bath solution "state" compared to a "preselected state" generates an error signal.

Based on the error value, types of dispensing apparatus, such as control valves and metering pumps, dispense the appropriate materials into the bath. An apparatus may also indicate and record concentrations of the chemical species or other relevant parameters of the bath.

The prior art discloses a computer or some other similar equipment used to coordinate and/or supervise scan, data logging, and system control functions for these various processes.

PROBLEMS WITH THE PRIOR ART

The prior art only controls the concentration of some solution species. Typically these species are some of the ones that accumulate or deplete relatively rapidly in the solution. Many chemical processing solutions are complicated by numerous chemical species that accumulate or deplete at different rates and exist in different concentrations. This myriad of chemical species in a chemical bath result from the bath dynamics which includes: multiple chemical reactions that consume certain ingredients and generate by-product species; addition of replenishing species and additives; introduction of contaminants from various sources; breakdown of unstable species, and catalytic effects (such as poisoning) by certain agents. The prior art does not address the existence of most of these species.

These various bath species can be categorized. For instance, some of the species (deliberate species) are deliberately added to the bath to replenish the amount consumed in the interaction between the bath and the workpiece. Some of these species are replenished in proportion to how fast the species is consumed. (The prior art typically deals mainly with the most rapidly depleting species in this category.) Other deliberate species, e.g. counterions, though deliberately added to the bath because they are chemically associated with replenished species, do not directly participate in the interaction between the bath and the workpiece. Still other species, within a class called non-deliberate species, accumulate and deplete at a rate related to the bath/workpiece interaction. (Non-deliberate species are those not intentionally included in the bath.) Some of these non-deliberate species related to the bath/workpiece interaction have concentrations so small that they can not be measured. Other non-deliberate species, such as some impurities in the deliberately added species, exist in the bath independent of the other bath reactions. Some species accumulate and deplete over time and are independent of the reactions associated with the bath and the workpiece.

While the prior art has succeeded in automatically monitoring and replenishing a plurality of chemical species in chemical baths, the prior art does not describe replenishing or controlling a bath to maintain all bath species at constant concentration. In fact, beyond the few chemical species that the prior art controls in a particular bath, the prior art does not identify or classify any uncontrolled species in the bath nor does it recognize the importance of these uncontrolled species in controlling bath aging. As a result, as is shown below, the prior art does not control bath aging. The prior art also does not discuss the importance or the control of the deliberately added counterion species. Because of electroneutrality, it is impossible to replenish an ionic species, e.g. iron, consumed in the bath/workpiece reaction without also adding a counterion, e.g., $SO_4^{2-}$ or $Cl^-$. Therefore, it is very common for solution concentration control schemes to keep some consumed species concentrations constant at the expense of systematically increasing the unconsumed counterion concentration in the bath. Many prior art control schemes do not address increasing counterion concentration which can degrade performance of the solution.

The prior art also is excessively dependent on measurement and/or monitoring of each chemical species that it controls. There is no mention of a method which can comprehensively predict the necessary replenishment rates of the species with minimal or no measurement or monitoring. The prior art also does not control bath concentrations of species that it does not measure.

Certain species deplete or are generated by reactions not associated with the process itself but rather which occur spontaneously with time. These reactions include: spontaneous homogeneous or heterogeneous reactions, spontaneous decomposition (or "spoilage"), air oxidation, and the introduction of airborne particles. The prior art does not recognize or teach a solution to the problems these factors cause in wet chemical bath control.

In some prior art methods, as the concentration of the unaccounted for species changes, i.e., the bath ages, the affect of the bath on the workpiece also changes. Because these prior methods do not prevent bath aging, the workpiece quality drifts and eventually falls outside of the required specifications. At this point the prior methods suggest discarding the bath and starting the process over. This gradual deterioration of the bath and produced workpiece occurs even though the comparatively higher concentration and rapidly changing species are controlled.

In the manufacture and fabrication of high precision products and components, an extreme degree of control over each manufacturing step is often required. Since the performance of a wet chemical process depends on the bath composition, it is generally advantageous and sometimes necessary to keep every chemical constituent (species) within a narrow concentration range.

Some workpieces exposed to wet chemical processes, especially high-technology workpieces, require strict product uniformity. In these cases, the bath variations of the prior art are troublesome. In our invention, the constant bath performance and minimal bath drift (aging) produce more uniform workpieces because all chemical species concentrations are controlled within a tight range. This solves a long felt need in industry.

OBJECTIVES

In view of the above mentioned problems, it is the objective of this invention to provide an improved method for controlling the concentration of chemical species in a wet chemical bath in order to extend bath age beyond the capability of prior art methods.

Another objective of this invention is an improved chemical bath control method which maintains a constant concentration of all deliberate chemical species.

Another objective of this invention is an improved chemical bath control method which maintains all deliberate and non-deliberate bath species at constant concentration.

A further objective of the invention is an improved method for controlling the concentration of species in wet chemical baths that are generated or depleted by "spontaneous" reactions.

SUMMARY OF THE INVENTION

The present invention maintains constant chemical species concentrations in a wet chemical bath solution which treats a solid workpiece.

The bath chemical species are categorized in several ways, with some species falling into more than one category. One category comprises process-active species which are either consumed or generated in the reactions between the chemical bath and the workpiece. A second category includes non-process-active species which are not consumed or generated by the bath/workpiece reactions. A third category, deliberate species, are those species intentionally included in the bath, while non-deliberate species, the forth category, are species that are not intentionally included in the bath. Time-active species, the fifth category, accumulate or deplete in time, independent of the bath/workpiece reaction.

The present invention uses three novel control schemes in combination to control some or all chemical species concentrations in the wet chemical bath. Mass-Balanced Reagent Compensation (MBRC) is based on the bath stoichiometry and a material balance on each deliberate species. MBRC essentially maintains the concentration of the deliberate species constant, with the exception of the gradual variation of time-active deliberate species. Service-Linked Volume Exchange (SLVE) maintains the concentration of non-deliberate species constant by controlling the total replenishing volume added to the bath. Again, there is some gradual variation of the time-active non-deliberate species. Evenly-Paced Service Density (EPSD) (in conjunction with MBRC and SLVE) maintains each time-active species at constant concentration.

By using these novel control schemes in combination to maintain a constant concentration of all species in a wet chemical bath, the present invention is able to extend bath life indefinitely and to produce more uniform workpieces within tighter tolerances than any prior art method known to the inventors.

BRIEF DESCRIPTION OF THE DRAWINGS

FIG. 1 shows the classification of chemical species related to a bath process in a typical wet chemical bath.

FIG. 2 is a block diagram of a Steady State Bath Control system which uses the control methods of the present invention.

FIG. 3A and 3B are tables which list the symbols, variables, and constants used to describe the present invention.

DETAILED DESCRIPTION OF THE INVENTION

A wet chemical bath comprises a solvent, usually but not necessarily water, which contains various dissolved or suspended chemical species. See FIG. 1. Each species can be categorized as either process-active (P) or non-process-active (nonP), either deliberate (D) or non-deliberate (nonD), and either time-active (T) or non-time-active (designated by the suffix nonT but this suffix is often omitted). Each process-active species can be further categorized as rapid (subscript R) or gradual (subscript G).

P species participate in the chemical or electrochemical process performed by the bath upon the workpiece. They are either consumed or generated at a rate related to the process (bath) service, S (defined below). The chemical reactions or transformations that proceed at a rate proportional to the rate of the process service are called "service-linked." A rapid process-active species ($P_R$) accumulates or depletes at such a rate that its change in concentration tends to upset the process within a short time. A gradual process-active species ($P_G$) takes a longer time to cause a deleterious upset to the bath. Factors that affect how long a P species takes to upset the bath include: the rate of the reaction associated with the P species, the change in relative concentration of the P species, and the impact of the change on the process.

Non-process-active, nonP, species are not consumed or generated by the reactions between the bath and the workpiece. However, these species may be catalysts or otherwise influence the bath reactions. nonP species do not generate or deplete in relation to the process service but their concentrations may be upset by other causes, for instance by replenishment.

Deliberate, D, species are put into the bath intentionally. These are the "nominal" ingredients of the bath. Deliberate species can be rapid process-active (D-$P_R$), gradual process-active (D$P_G$), or non-process-active (D-nonP).

Non-deliberate (nonD) species occur in the bath without being intentionally added. They normally exist in the bath in low concentrations. Some nonD species are known or predictable while other appear unpredictably or are difficult to detect. They may be non-deliberate, process-active (nonD-P) or non-deliberate, non-process-active (nonD-nonP). It is not necessary categorized the nonD species into rapid or gradual. The nonD include reagent impurities, dragged-in impurities (impurities introduced by the workpiece), breakdown products of other species, and anode dissolution products.

Non-deliberate, process-active species (nonD-P) accumulate or deplete at a rate related to process service but primarily due to ancillary reactions. For instance, the nonD-P species might include anode dissolution impurities and breakdown products from the electrolytic reaction of additives.

Non-deliberate, non-process-active (nonD-nonP) species originate from sources other than the process reaction. These species might include inert soluble impurities occurring in the chemicals used to prepare the bath.

Time-active (T) species are consumed or generated by reactions (normally unwanted) that occur spontaneously over time in the bath, i.e., reactions that are time-linked rather than service-linked. T species include air oxidation, chemical degradation, corrosion, products of spontaneous homogeneous or heterogeneous reactions, spontaneous bath decomposition or "spoilage", or the introduction of airborne particles.

Spontaneous reactions proceed as time passes. For example, an $Fe^{2+}$ ion oxidizes spontaneously to produce an $Fe^{3+}$ ion or an $Sn^{2+}$ ion oxidizes to produce an $Sn^{4+}$ ion. Certain homogeneous bath reactions take place within the solution sometimes due to the presence of chemicals like dissolved oxygen. Other heterogeneous reactions take place between different materials at the solid-liquid interfaces. Such reactions generally occur whether or not the bath process is being carried out.

Note that T species, in addition to being spontaneously active, fall into one of the other species categories discussed above. For example, T species can be deliberate rapid process-active (D-$P_R$-T), deliberate gradual process-active (D-$P_G$-T), deliberate, non-process-active (D-nonP-T), non-deliberate, process-active (nonD-P-T) or non-deliberate non-process active (nonD-nonP-T). Those species which are both process-active and time-active undergo concentration changes as a result of both the desired process reactions and the unwanted spontaneous reactions.

Certain species, i.e. the process-active or P species, in a wet chemical process are generated or consumed at a rate proportional to the process service, S. S is a quantity that reflects the amount of processing that the bath has performed. The choice of a specific measure or index for S is somewhat arbitrary, but it is best to choose a convenient external indication. In electrolytic processes there is a particularly convenient choice, i.e., the amount of Faradaic charge that has been passed (e.g., the time integral of the plating current). In non-electrolytic processes the number of workpieces treated can be adopted as a measure of process service. This choice is valid only if each workpiece causes roughly the same amount of chemical changed to the bath, i.e., each workpiece should have the same active surface area and be exposed to the bath for the same amount of time. Alternatively, process service can be based on a measured change in the quantity of a consumed or generated bath species; however, this choice could defeat one of the advantages of the present method, namely the avoidance of unnecessary bath analysis.

Steady State Bath Control (SSBC) uses one or more of three separate and novel control strategies to maintain constant concentration of all chemical species in the bath. The control schemes are denoted by the abbreviations MBRC, SLVE, and EPSD.

MASS-BALANCED REAGENT COMPENSATION (MBRC)

Under the MBRC scheme, a material balance model is created by using the stoichiometry of the process reactions involving the deliberate (D) species. The model consists of a system of equations, one equation governing each deliberate species. Each equation is developed by performing a mass balance on its associated deliberate species. The equations, called the "overall material balance equations," take the following general form:

feed volume×(concentration in feed−target bath concentration)=amount consumed by reaction.

The material balance model is used to predict the amount of each deliberate species to add to the bath in order to keep the D species near their target concentrations. The MBRC scheme is implemented using some or all of four methods: advantageous feed formulation (AFF), stoichiometry-predicted dosing (SPD), analysis-based correction (ABC), and analysis-based tuning (ABT). AFF is a method of mixing feed stocks in conformance with the material balance so that all deliberate species can be replenished in the correct proportions. SPD determines how much of each deliberate species is consumed (or accumulated) as the bath reactions progress, and SPD replenishes (or dilutes) the bath to compensate. ABC is used periodically to determine if any important concentrations have drifted from their targets and performs any necessary corrective dosing. ABT adjusts coefficients within the model itself to make the model conform better to actual process performance.

Advantageous Feed Formulation (AFF)

The MBRC scheme dictates how the feed stock for each D species is formulated. Using advantageous feed formulation (AFF) described below, feed stocks are mixed for the D-P species. Although individual feed stocks are sometimes mixed for the deliberate non-process-active (D-nonP) species, these species are usually included in the other feed stocks according to the material balance. As will be demonstrated in an example below, reasons of convenience or chemical compatibility may also impose practical constraints on the material balance and feed stock mixing.

Using AFF the bath feed stocks are formulated according to the following general rules:

1. Assign each known species in the bath to one of the following categories (see FIG. 1):
   a. solvent
   b. deliberate, rapid process-active (D-$P_R$)
   c. deliberate, gradual process-active (D-$P_G$)
   d. deliberate, non-process-active (D-nonP)
   e. non-deliberate, process-active (nonD-P)
   f. non-deliberate, non-process-active (nonD-nonP)
2. Write the overall stoichiometry of the system of process reactions. Include all known reactions and estimate all relative rates as precisely as possible. (Empirical measurement of changing species is an alternative way to quantify relative rates of change.) Assign for each D species an apparent stoichiometric coefficient $k_i$ according to the equation $\Delta c_i = k_i \Delta s$. (Using this equation, $k_i$ can be calculated by empirically determining $\Delta c_i$ and $\Delta s$.) $k_i$ will be negative for depleting species, positive for accumulating species, and zero for nonP species.
3. Make a separate feed solution for each D-P species (both D-$P_R$ and D-$P_G$).
   a. If the species is electrically neutral, such as an organic additive, make a concentrated solution of the species in the solvent.
   b. If the species is an ion, guarantee that addition of the feed solution according to the nominal schedule will not cause this ion's counterion to accumulate in the bath. (See Rule 5.)
4. Formulate each stock solution so that the concentration of the associated D-P species is as high as possible. (The D-P feed stock concentration must at least be higher than the nominal concentration of the D-P species in the bath.) This has three advantages, i.e., it:
   a. allows the lowest possible volume-exchange rate (lowest value of K) to be selected. See the SLVE discussion below for a definition of K.
   b. brings a depleted bath to the steady-state condition more quickly.
   c. presents the least risk of over diluting the bath with solvent.
5. Formulate the feed stocks so that, when each is added to the bath in the quantity prescribed by the estimated reaction stoichiometry during a period of processing, no change in the concentration of any D-nonP species will occur. An equivalent requirement is that the mixture that would result from dispensing the feed doses into an empty container must contain each D-nonP species in the same ratio of concentrations as in the bath.
6. If possible, the feed solutions should also be formulated so that they can be blended in some proportion to produce a solution that contains each deliberate species at its target bath concentration. If practical constraints prevent this, formulate an additional "fresh bath" feed solution that is identical in composition to the nominal bath.
7. Finally, a feed solution comprising pure solvent shall be used as a makeup to compensate for evaporation.

Constraints may be applied to the material balance in cases where species in a feed stock are chemically incompatible or for other practice reasons. Other feed stocks may be prepared for general convenience or to replenish species that are depleted in infrequent situations.

Stoichiometry-Predicted Dosing (SPD)

All deliberate species (D-P and D-nonP), whether time-active or not, are replenished by adding stock solutions to the original bath. The stock solutions for replenishing D-P species are metered into the solution so that strict adherence to the overall bath material balance on all process-active species is maintained. (See the overall material balance equation discussion above.) The method of adding feed stocks is called stoichiometry-predicted dosing (SPD). If the feed stocks are mixed according to the method above, adding the feed stocks in accordance with the material balance will insure that the concentrations of all deliberate species in solution remain constant.

In practice, SPD is performed by satisfying the following equation for each deliberate species i $$\sum_{j=1}^{n_F} \Delta V_j(c_{ij} - c_i^p) = k_i \Delta S.$$

where:
$n_F$ is the number of chemical feeds used in SPD,
$\Delta S$ is the process service performed by the bath in a given time period, $\Delta t$,
$\Delta V_j$ is the volume of feed stock j added to the bath to compensate for the service increment $\Delta S$,
$c_{ij}$ is the concentration of species i in feed stock j,
$c_i^p$ is the desired concentration of species i in the bath, and
$k_i$ is the apparent stoichiometric coefficient for species i.

The above system of "SPD equations" must be solved algebraically to determine the dosing volumes, $\Delta V_j$. An additional constraint is added by the SLVE scheme (explained below), which relates the sum of the individual feed volumes, $\Delta V_{TOT}$, to the service increment $\Delta S$.

It should be remembered that $k_i$ has a nonzero value for each process-active (P) species and is zero for all non-process-active (nonP) species. If $k_i$ is positive, the feed enriches the bath with species i; if $k_i$ is negative, the feed decreases the concentration of species i by dilution.

Analysis-Based Correction (ABC)

In analysis-based correction, the bath is directly monitored to determine if any deliberate species is not on target. On-line monitoring is desirable and is especially preferable for rapid process-active ($P_R$) species. In other cases, periodic off-line monitoring is adequate. If one or more deliberate species is off target, the MBRC/ABC adds the appropriate stock solution or combinations of stock solutions, in accordance with the material balance model, to bring all deliberate species back on target. Spot adjusting is the adding of stock solution to bring off target D species back on target.

The ABC scheme may adjust the bath not only with the regular feed solutions used in the SPD scheme, but also with special correcting feed solutions. The compositions and doses of such special feeds are governed by the "ABC equation:"

$$\Delta V^{CORR}(C_i^{CORR} - C_i^{MEAS}) = V(C_i^p - C_i^{MEAS})$$

where
$\Delta V^{CORR}$ is the volume of the special correcting bath replenishment feed to be added.
$C_i^{CORR}$ is in the concentration per unit volume of the species i in the correcting feed.
$C_i^{MEAS}$ is in the concentration per unit volume of the species i measured in the bath.

Analysis-Based Tuning (ABT)

In analysis-based tuning, a cumulative record of dosing volumes is used at infrequent intervals to adjust the apparent stoichiometric coefficients so that the model may give an improved estimate of the necessary dosing rates. ABT helps the bath-control system to adjust to changing conditions and avoid drifts in the chemical state of the bath.

Between tunings, ABT keeps a record of the cumulative volume of each chemical feed that has been dispensed (including special corrective feeds used during ABC). The "ABT equation," used to select the revised value of $k_i$, is:

$$k_i^{NEW} = \theta k_i^{OLD} + (1-\theta)\left(\sum_{j=1}^{n_{TOT}} c_{ij}\Delta V_j^{SINCE} - c_i^p \Delta V_{TOT}^{SINCE}\right)/\Delta S_{SINCE}.$$

where:
$k_i^{NEW}$ is the new apparent stoichiometric coefficient for species i,
$k_i^{OLD}$ is the old apparent stoichiometric coefficient for species i,
$n_{TOT}$ is the total number of feed stocks including both the ordinary stocks used in SPD and any special correcting stocks that may be used in ABC,
$\Delta V_j^{SINCE}$ is the cumulative volume of feed stock j dispensed since the last tuning,
$\Delta V_{TOT}^{SINCE}$ is the combined cumulative volume of all the feed stocks dispensed since the last tuning (including special correcting stocks),
$\Delta S_{SINCE}$ is the amount of process service performed by the bath since the last tuning, and
$\theta$ is a relaxation factor whose value is generally chosen to be nonzero to avoid over-reacting to the apparent stoichiometric behavior observed over a single interval between tunings.

When the above equation is used for ABT, the bath should be at its target composition, as if recently adjusted by ABC. The interval between tunings (expressed by $\Delta S_{SINCE}$) should be long enough to reflect statistically significant deviations, but short enough to avoid prolonged operation with erroneous $k_i$ values.

Alternatives to Analysis-Based Correction and Tuning

In some cases, no method exists for direct chemical analysis of one or more process-active species in the bath. In such cases, analysis-based correction and tuning (ABC and ABT), as described above, cannot be used for those "unanalyzable" species. However, the present invention includes an alternate scheme, which employs indications of process performance or other indirect methods of observation to identify and correct drift in the unanalyzable species. This scheme is referred to as performance-based correction (PBC) and tuning (PBT). Examples of performance-based monitors include the use of dummy workpieces and their subsequent inspection to reveal departures from optimal conditions. One particular example from electroplating is the Hull cell, which involves inspection of plated test coupons to infer the chemical state of the bath. The key difference between the analysis-based and performance-based schemes is that the latter is predicated on the processing action of the bath rather than its direct chemical composition. For example, in electroplating, an organic additive is often used to increase the brightness of the deposit. If no analysis for this additive exists, the alternative is to inspect the plated films over time. A decline in reflectivity may indicate that the metering rate of the brightening additive has been too low. The proper corrective action would be to add an estimated volume of the additive immediately and to raise the corresponding value of $k_i$ used in the SPD scheme. While performance-based monitors do reflect the bath's chemical state, they do so only indirectly and are prone to interference from other factors. Accordingly, PBC and PBT should only be used when ABC and ABT are not feasible because of the lack of direct methods of chemical analysis. PBC and PBT are further illustrated below in Example 2.

Solvent-Evaporation Compensation (SEC)

In systems in which the solvent evaporates at a rate that will result in significant excursions in dissolved-species concentrations, it is advantageous to use a direct monitor to detect the extent of evaporation. The best way to detect how much of the solvent has been lost to evaporation is by direct measurement of a D-nonP-nonT species in the bath. Such species have no reason to change in concentration other than evaporation or over addition of the solvent. This species should be present at high concentration and should be easy to monitor accurately, by on-line measurement if possible. For example, the Cl— ion in the permalloy bath (see "Example 2: Permalloy Plating Bath" below) is a suitable species.

The volume of solvent that must be added when the concentration, of this "indicator species" exceeds its target value is given by the "SEC equation:"

$$\Delta V_{SOLV} = \left( \frac{c_i^{MEAS}}{c_i^o} - 1 \right) V,$$

where:
$\Delta V_{SOLV}$ is the dosing volume of solvent required,
$C_i^{MEAS}$ is the measured concentration of the indicating species,
$C_i^o$ is the target concentration of the indicating species, and
V is the current bath volume.

A less direct, but highly convenient and practical alternative to "indicator-species" method above is to base evaporation compensation on the measured density of the bath. This method is best suited for baths for which the specific gravity does not change substantially during the course of the process reactions. The "density-based SEC equation" is $$\Delta V_{SOLV} = \left( \frac{\rho^{MEAS} - \rho^{H2O}}{\rho^o - \rho^{H2O}} \right) V,$$

where:
$\rho^{MEAS}$ is the measured density of the bath,
$\rho^{H2O}$ is the density of pure water,
$\rho^o$ is the density of a bath at its target composition, All densities above must be measured at the same temperature or else adjusted for thermal expansion using empirical data. This may require independent measurement of the density-cell temperature. Also, it should be noticed that the actual bath volume is required information for SEC by either method; a measure of bath volume may be required.

SERVICE-LINKED VOLUME EXCHANGE (SLVE)

The SLVE control scheme is a novel method to control the non-deliberate (nonD) species with minimal or no monitoring. SLVE holds most nonD species at constant concentration without the need to analyze or even to identify these individual species. This is one of the most important and far reaching benefits of SSBC, i.e., the effects of nonD species on a chemically reacting solution can be controlled with less dependence on troublesome, expensive, unreliable, and specific chemical analysis. Non-deliberate, process-active (nonD-P) species are controlled because the SLVE scheme replenishes (or removes, i.e., decreases concentration by dilution) the exact amount of the nonD-P species consumed or generated by the process. Non-deliberate, non-process-active (nonD-nonP) species also remain at steady concentration because the amount per volume of nonD-nonP species in the feed mixture equals the amount per volume in the bath. SLVE dictates that the total amount of replenishing volume, $\Delta V$, for a given processing period, be proportional to the amount of process service, $\Delta S$, the bath underwent during that same period. The proportionality constant is called the service-linked rate constant, K. Alternatively, $\Delta V_{TOT} | \Delta S = K$.

Under MBRC control, different feed stocks replenish the solution to bring the changed concentrations of the deliberate species to their original value. Using only MBRC control, the aggregate volume of all feed stocks added to the bath is arbitrary as long as the deliberate species obey the material balance. However, using MBRC alone, the concentrations of the non-deliberate species (nonD) are likely to vary. If the combined replenishing volume is too large, the resulting steady-state non-deliberate (nonD) species concentration in the new bath will be more dilute than in the original bath. Likewise, if the replenishing volume is too small, the resulting steady-state concentration of the nonD species in the resulting bath will be higher than in the original bath. SLVE control replenishes the bath with the precise aggregate volume of all feed stocks in order to maintain the steady-state concentration of nonD species in the bath.

Under SLVE control, the quantity called service density, s, is useful to define. Service density is defined as the average amount of service that a unit volume of the bath has performed. Accordingly, the service density represents the average "age" or "experience" of the bath. The value of s increases as the bath is used and decreases as fresh feed is introduced. Service density, s, is a direct measure of the extent to which service-linked chemical reactions have taken place per unit volume of the well mixed bath.

In any given process interval, $\Delta S$, the service density, changes from the value $S_{OLD}$ to the value $S_{NEW}$ as follows:

$$S_{NEW} = S_{OLD} + \Delta S | V - S_{OLD} \Delta V_{TOT} | V$$

where:
$\Delta V_{TOT} | V$ equals $\Delta v$, the fractional exchange volume or the amount of feed added per unit bath volume,
the $\Delta S | V$ term represents the extent to which the bath has "aged" per unit volume, and
the $S_{OLD} \Delta V_{TOT} | V$ term can be viewed as the extent to which the bath has been "rejuvenated" per unit volume.

The object of SLVE is to maintain s at a target value, $S_{TGT}$. $S_{TGT}$ can be thought of as the desired bath age. $S_{TGT}$ is usually the point of optimum steady state bath performance and occurs after the bath has been "working" for an initial time period. (In some baths, for example in certain plating baths, this optimal age is reached by "dummy plating", i.e., plating unused workpieces.) $S_{TGT}$ is the reciprocal of a constant, the specific volume exchange ratio, K. Once the desired value of $S_{TGT}$ is determined, the associated K value is calculated. The K value is used to determine how much exchange volume is needed to replenish the bath in order to "freeze" the bath at the optimal age for prolonged operation. By keeping track of and controlling s, the bath can be brought to and maintained at this optimal state in an informed, controlled manner.

Over the course of processing with replenishment using the MBRC and SLVE methods, the volume of the bath will gradually increase. Although this will have no effect on the composition of the bath, it is usually desired from a practical standpoint to prevent indefinite accumulation of the bath. The recommended approach is to allow a small volume of the bath to be drained or otherwise removed from the system at frequent intervals. Since removing a portion of a well-mixed solution does not cause any change to its chemical composition, there is some freedom in selecting a method and schedule for removal. However, it is necessary for the bath to be well mixed at the time removal is performed: sufficient time must be allowed after feed dosing or processing, which may cause a temporary inhomogeneity of bath composition.

It is important to recognize that SLVE can be used to keep a bath at constant composition even when MBRC is not used. As long as the aggregate feed mixture is of constant composition and of volume proportional to service performed, all non-time-active species in the bath will reach and maintain constant concentrations. These may not be the desired concentrations or the starting concentrations in the bath, but they will be constant. In some wet processing applications, it is more important to prevent non-deliberate species from accumulating that it is to keep the deliberate species from assuming steady values different from their starting values. In such cases, SLVE can be quite useful without MBRC. MBRC is needed only when there is a particular need to keep one or more deliberate species at preselected target values.

EVENLY-PACED SERVICE DENSITY (EPSD)

The EPSD constraint guarantees that the spontaneous or "time-linked" chemical transformations proceed in lock-step with the service-linked transformations. EPSD requires that the same amount of bath service per unit volume, $\Delta s$, is expended in each unit of time, $\Delta t$. In other words, $\Delta s | \Delta t =$ pace, a constant.

As mentioned above, certain species, i.e. process-active (P) species, are generated or consumed at a rate proportional to the process service, S. Furthermore, service density, s, defined in the SLVE section above as the average amount of service that a unit volume has performed, is a direct measure of the extent to which service-linked chemical reactions have taken place per unit volume of bath. In other words, controlling the service density controls the generation of the service-linked species in a unit volume of the bath. Therefore, by controlling the bath so that it passes the same process service in each of a series of equal time intervals, the service-linked chemical reactions in a unit of bath volume will proceed to the same extent in each of these equal time intervals.

Since the time-active species progress at the same rate in a given time interval, keeping service-linked changes constant during each chosen time interval will insure that both the non-time-active (both process-active and non-process-active) and time-active species accumulate or deplete at a constant relationship among each other. This is accomplished by the EPSD requirement described above.

By applying the EPSD requirement, the effects on the bath due to the performance of process service will be in a constant relation with the effects on the bath due to time. For example, an electrolytic bath (of steady volume) that obeys EPSD passes the same amount of charge each 24-hour period. For this bath, the T species and nonT species will remain at constant concentrations. Using a different less precise time-based control example, a bath passes the same charge on each of five consecutive work days and zero charge over the weekend, but the total charged passed each week is constant. In this last example, the T species will be at slightly different concentrations after the weekend than at the end of the week, however on a week-to-week basis, the T species and nonT species concentrations will not drift.

It should be pointed out that EPSD and SLVE can be used together without MBRC to keep all chemical species in a bath (whether time-active or non-time-active) at constant concentrations. The resulting steady-state concentrations may not coincide with the desired or target values, but they will be constant, and this may be adequate in some wet processes. MBRC is only necessary when individual manipulation of the deliberate-species concentrations is required.

PREFERRED EMBODIMENTS

There are a number of applications for a control method which permits more precise, efficient, and economical control of wet chemical bath compositions. Examples from the electronics industry include etching of alumina, development of photosensitive polymers, etching of copper in printed circuit boards, electroplating of permalloy for magnetic recording heads, and electroless plating of disks. Virtually any wet chemical process in which a solution must be maintained at constant composition despite consumption or generation of one or more chemical species by the process reactions can benefit from this novel method. As a result, there is no one specific preferred embodiment for this method. However, two examples are presented here as illustrations of the practical application of the method.

EXAMPLE 1: PERMALLOY BATH

This example presents a description of the use of a SSBC wet chemical bath for precision electroplating of permalloy (iron and nickel) films to fabricate magnetic devices. Devices like magnetic recording heads require magnetic films in precise thicknesses with exact magnetic characteristics. An example of a process for making these films is given in U.S. Pat. No. 4,102,756 to Castellani et al. which is incorporated herein by reference.

MBRC FOR THE PERMALLOY BATH

The permalloy bath nominally contains 148.3 mM $NiCl_2$, 56.0 mM $NiSO_4$, 4.3 mM $FeSO_4$, 404.3 mM $H_3BO_3$, 427.8 mM NaCl, 0.6 mM $H_2SO_4$, 6.22 mM sodium saccharin, and 10.0 mg/l of a surfactant called FC95. FC95 is a trademark of the 3M company.

AFF for the Permalloy Bath

Application of the seven rules for advantageous feed formulation to the permalloy bath is illustrated below.

Categorization of Species (AFF Rule Number 1)

The deliberate species are classified as follows: $Ni^{2+}=D\text{-}P_G$; $Fe^{2+}=D\text{-}P_R\text{-}T$; $H^+=D\text{-}P_R$; $Cl^-=D\text{-}nonP$; $SO_4^{2-}=D\text{-}nonP$; $Na^+=D\text{-}nonP$; $H_3BO_3=D\text{-}nonP$; saccharin=D-nonP; FC95=D-nonP. $Fe^{2+}$ is classified as time-active because it oxidizes spontaneously to $Fe^{3+}$, a nonD-P-T species. The other non-deliberate species include anode impurities released into the bath as the anode dissolves and products of the decomposition of saccharin. (This decomposition is too slow to warrant classification of saccharin as D-P, however.) The nonD-nonP-T species include spontaneous breakdown products which develop over time but do not participate in the bath/workpiece interaction. The nonD-nonP-nonT species include reagent impurities which enter the bath along with the D species.

Apparent Stoichiometry of the Process Reactions (AFF Rule Number 2)

The apparent stoichiometry of the reaction system is determined by identifying the known process-linked reactions of the D-P species. These are:

$$Fe^{2+}+2e^-\rightarrow Fe,$$

$$Ni^{2+}+2e^-\rightarrow Ni,$$

$$2H^++2e^-\rightarrow H_2,$$

which occur at the cathode, and $$Ni\rightarrow Ni^{2+}+2e^-,$$

which occurs at the anode. The corresponding coefficients of apparent stoichiometry for the system are:

$$k_{Fe2+}=-0.13|2F=-0.0024 \text{ mole}/A\text{-hr}$$

$$k_{H+}=-0.26|F=-0.0096 \text{ mole}|A\text{-hr}$$

$$k_{Ni2+}=(1.00-0.61)|2F=0.0114 \text{ mole}|A\text{-hr}$$

where F is Faraday's constant, 26.8 A-hr|equivalent, and there are two equivalents of charge transferred per mole of $Ni^{2+}$ or $Fe^{2+}$ and one equivalent per mole of $H^+$. $k_{Ni2+}$ is positive because more $Ni^{2+}$ is generated at the anode than is consumed at the cathode. It is obvious from the $k_i$ values that, without compensation, $Fe^{2+}$ and $H^+$ would deplete and $Ni^{2+}$ would accumulate over time. The above values are consistent with the description that the cathodic current is distributed with 13% to $Fe^{2+}$ reduction, 26% to $H^+$ reduction, and 61% to $Ni^{2+}$ reduction, while the equal and opposite anodic current corresponds to 100% Ni oxidation.)

Feed Stocks for Each D-P Species (AFF Rule Number 3)

The rules for advantageous feed formulation (AFF) suggest the use of three chemical feed stocks ($n_F=3$, one for each D-P species). These are called Iron Stock (IS), Nickel Stock (NS), and Acid Stock (AS).

High-concentration D-P Stocks (AFF Rule Number 4)

It would be ideal to make each D-P stock of identical composition to the permalloy bath, but with the principle ion at some higher-than-nominal concentration. A good way to do this is first to calculate the total number of milli-equivalents per mole (or mN) of the three D-P ions in the target bath. This total is 418.2 mN for the bath composition above (296.6 mN $Ni^{2+}$ as chloride, 112 mN $Ni^{2+}$ as sulfate, 8.6 mN $Fe^{2+}$ as sulfate, and 1.0 mN $H^+$ at pH 3.0). Then the three stock solutions for each of the three species, $Ni^{2+}$, $Fe^{2+}$, and $H^+$, are each formulated to contain 418.2 mN of one ion and none of the other two ions. For example, Nickel Stock is formulated as identical to the nominal bath but with all the $Fe^{2+}$ and $H^+$ replaced equivalent-for-equivalent by $Ni^{2+}$. Such an "ideal" set of feed stocks would allow easy satisfaction of Rules 5 and 6, but, unfortunately, Acid Stock cannot be made this way because some of the non-process-active species, namely saccharin and boric acid, are not sufficiently stable and soluble at the low pH corresponding to 418.2 mM HCl. This incompatibility could be avoided by splitting Acid Stock into two components, but the complexity of adding another dosing pump was considered prohibitive. To solve this problem, the base salts were removed from the acid stock and placed in correspondingly increased concentration in the iron stock. Since the ratio of depletion rates of $Fe^{2+}$ and $H^+$ is known from the apparent stoichiometry (the values of $k_{Fe2+}$ and $k_{H+}$), the properly balanced iron and acid stocks formulation, when added in proper ratios, will still maintain the constant concentrations of D-$P_R$ species in the bath.

Mass Balance on D-nonP Species (AFF Rule Number 5)

This rule is especially relevant to ionic baths such as the present example, since the process-active species are ions (cations in this case) and cannot be replenished without also introducing counterions (anions). While there are only three D-P species, the total number of D species, $m_D$, is 9. The following simplification is used to reduce the complexity of the material balance. The six D-nonP species, $SO_4^{2-}$, $Cl^-$, $Na^+$, $H_3BO_3$, saccharin, and FC95, can be grouped together as a single, electroneutral "pseudospecies" given the name X. Accordingly, we represent the mixture 404.3 mM $H_3BO_3$, 307.2 mM NaCl, 60.3 mM $Na_2SO_4$, 6.2 mM saccharin, and 10 mg/l FC95 as "404.3 mM X." Only part of the bath's $Cl^-$ ion is contained in X. The target composition of the bath can now be expressed in terms of five "species" as 204.3 mM $Ni^{2+}$, 4.3 mM $Fe^{2+}$, 1.0 mM $H^+$, 209.6 mM $Cl^-$, and 404.3 mM X.

The material balance equations for stoichiometry-predicted dosing (SPD) take the form:

$$\sum_{j=1}^{n_F} c_{ij}\mu_j - c_i^p = k_i/K,$$

one equation for each of the five species, i. This set of equations can be reduced to four since $Cl^-$ is both non-process-active ($k_{Cl-}=0$) and linked to $Fe^{2+}$, $Ni^{2+}$, and $H^+$ by electroneutrality. Because of the departure from the "ideal" stock formulation described above and because this departure involved taking components from one stock and combining them with another in a proportion that depends on the values of $k_i$ and K, it is not possible to fix the formulations of the three new stocks so that the material balance will be obeyed for any values of $k_i$ and K. Hence the concentration of X in Iron Stock, $c_{X,IS}$, is treated as an unknown along with $u_{IS}$, $u_{NS}$, and $u_{AS}$, a total of four unknowns in four equations. This system of equations is solved algebraically. For the nominal values of $k_i$ above and for K=0.18 l/A-hr, the stock formulations would be the following: NS=208.6 mM $NiCl_2$+404.3 mM X; AS=2000 mM HCl; IS=91.0 mM $FeCl_2$+351.7 mM X. If the values of $k_i$ were revised (as provided for in analysis-based tuning, for example) or if the value of K were changed for any reason, the formula for iron stock (IS) would have to be modified.

Ability to Blend to Nominal Bath Composition (AFF Rule Number 6)

The practical restraints explained above prevent this example from conforming exactly to rule number 6, i.e., there is no combination of the above set of chemical stock solutions which can be blended to form a solution with each deliberate species at its target bath concentration. However, the net effect of adding fresh bath along with concentrated compensating stocks is produced when the formulation of IS corresponds to the actual values of K and $k_{Fe2+}$ used in the SLVE and MBRC methods.

Pure Solvent Stock

Pure deionized water is dispensed with a fourth dosing pump.

The above example is meant to illustrate only and is not meant to indicate the only way to calculate feed concentrations and dosing volumes by using material balances.

SPD for the Permalloy Bath

The nominal dosing volumes are determined by the above system of algebraic equations for stoichiometry-predicted dosing. For a given increment in process service, $\Delta S$, the nominal dosing values are given by the equation $$\Delta V_j = u_j K \Delta S$$

The acid stock is delivered in direct response to an on-line pH meter rather than by stoichiometric prediction. This is done because the $H^+$ concentration (i.e. pH) must be held within a very tight range, $2.98 < pH < 3.02$, and because on-line pH measurement is straightforward, accurate, and reliable. Although a computer does not actually control the dosing of Acid Stock, it does record the cumulative volume dispensed for use in analysis-based tuning. Actual dosing is controlled by an analog pH controller with real-time feedback from the on-line pH sensor (a scheme that is well known in the art).

The above method for monitor-based dosing of acid stock is not the only possible embodiment of steady-state bath control for permalloy plating. The regular SPD method for acid stock with frequent ABC would also be acceptable.

After each plating run, or at several intervals during a long run, the system dispenses iron stock and nickel stock according to the SPD equation. In this embodiment, the system deliberately dispenses only 95 percent of the calculated volume of iron stock. This is done so that any drift in $c_{Fe2+}$ will be negative, since it is easier to make corrections by adding $Fe^{2+}$ than by diluting out of the bath. Nominally, the remaining 5 percent of the iron stock will be added at the time ABC is performed.

ABC for the Permalloy Bath

Since both $H^+$ and $Fe^{2+}$ are deliberate, rapid process-active species (D-$P_R$), frequent monitoring is required for both. $Fe^{2+}$ can be measured either on line, using the RDE monitor (described below), or off line by titration. The concentration of $Ni^{2+}$ changes quite gradually, and infrequent off-line measurement by titration is adequate. For any of these three D-P species, the ABT equation (under "Detailed Description of the Invention" above) is solved for the volume of correcting feed solution to be added. The D-nonP species require only infrequent off-line analysis (by titration, for example); if one of these species shows a non-trival deviation from the target, a specially formulated correcting feed should be prepared with reasonable effort using material balance methods to avoid imbalance to the other species in the bath.

ABT for the Permalloy Bath

Analysis-based tuning of the coefficients $k_{Fe2+}$, $k_{Ni2+}$, and $k_{H+}$ is performed at intervals typically ranging from 0.1 to 10 A-hr/l. The ABT equation (which appears under "Detailed Description of the Invention" above) is applied. As a consistency check, the sum of $k_{Fe2+}$ and $k_{H+}$ should equal $k_{Ni2+}$.

SEC for the Permalloy Bath

Solvent-evaporation compensation is based on three on-line measurements: density by an on-line Mettler/Paar DMA 40 density meter, temperature of the density-cell thermal jacket by thermistor, and bath-reservoir level by the Princo capacitive level meter. The computer converts these data into a temperature-compensated density and a total bath volume. The SEC equation (presented under "Detailed Description of the Invention") is used to determine the dose of deionized water required, if any. The computer then drives the water pump for the appropriate time. The above system is sufficiently sensitive to detect and to compensate for the evaporation of 100 ml from a 100-l bath. The SEC operation can be run as frequently as once every 15 minutes.

SLVE for the Permalloy Bath

The SSBC implements SLVE control for the permalloy bath by monitoring and tracking the bath process service and total volume dispensed. SLVE insures that the aggregate volume added to the bath is strictly proportional to this service. The process service used for this permalloy bath is the plating charge (plating current integrated over time). The plating charge passed in a given period of time has the value $\Delta S$. The aggregate volume of feed stocks that the SSBC dispenses to replenish the bath for the service performed in the selected time period is $\Delta V_{TOT}$. The computer calculates the aggregated volume $\Delta V_{TOT}$ from the relationship: $\Delta V_{TOT} = K \Delta S$.

In other words, when the SSBC dispenses a total amount of bath replenishing volume during a selected time interval in strict proportion to the process service performed during that time interval, the concentration of nonD-nonT species in the permalloy bath is kept constant.

Ordinarily, the volume of acid and $Fe^{2+}$ ion stock required to meet the constraints of the material balance is less than the $\Delta V$ required to meet the SLVE constraints. When this happens, enough additional nickel and iron stock (in the ratio required to make fresh permalloy bath) is added to the bath to increase the total feed volume to $\Delta V$. Alternatively, the amount of each feed stock dispensed is calculated by multiplying the fraction of the respective feed volume, $u_j$, by the total feed volume, $\Delta V$.

EPSD for the Permalloy Bath

EPSD is the final constraint applied by the SSBC. This constraint, when used with MBRC and SLVE, maintains the T species in constant concentration. EPSD dictates that s, the accumulated average service per unit volume, i.e., $\Delta S/V$, is the same in any given time period. This constraint is satisfied if the same plating current per unit bath volume is passed every week.

The pace for permalloy plating generally ranges from 0.1 to 10 A-hr/1-week, depending on process throughput requirements, electrode-area-to-volume ratios, plating current density, etc. A typical value would be 1 A-hr/1-week.

Apparatus for the Permalloy Bath

FIG. 2 shows a typical block diagram of a permalloy bath and a SSBC system of the present invention.

The mix tank and recirculation pump insure that the solution is well mixed and homogeneous as the solution enters the plating cell where the workpiece is plated.

A personal computer (PC) receives inputs representative of selected parameters (e.g. density from the densimeter and level from the level sensor) and chemical concentrations (e.g. $Fe^{2+}$ from the RDE monitor) from appropriate sensors. The PC carries out the MBRC and SLVE methods to determine the amount of each feed stock (except acid stock, as noted above) to add to the mix tank. Dosing is performed by four metering pumps, one for each feed stock, AS, NS, IS, and water.

As explained under "SPD for the Permalloy Bath" above, the pH is controlled by a pH controller which dispenses acid stock when the pH probe reads below 3.00. The cumulative volume of acid stock dispensed is read automatically by the computer.

This particular embodiment used an IBM PC/AT with a National Instruments GPIB Adapter (Part No 6451503) which interfaces with the signals from the bath sensors. (The PC/AT RS232 serial interface connects to the densimeter.) Some of the tasks were written in a process control language called COYOTE while other tasks were written in Microsoft C Version 5.0. The PC/AT passed information to a larger computer which serves in a supervisory capacity.

The type of computer and software format used is not considered critical to the practice of the present invention. The equipment used in this embodiment or any equivalent is considered the best mode of practicing the invention by the inventors. The invention can be practiced on any PC or larger computer using any hardware interface which is appropriate for the sensors selected. Any convenient software format suitable for process control would also be appropriate. Design and operation of computer process control systems is well known in the art.

The present embodiment used a Mettler/Paar DMA 40 D densimeter. It can detect evaporation loss to within 0.25 percent accuracy. The density and temperature are read by the computer, where the SEC algorithm determines the proper dose of water to be delivered by the water metering pump.

A Princo capacitive probe was selected as a level detector. This reads directly to the computer, which determines the bath volume, which, in turn, enters some of the MBRC calculations.

At the end of a plating run, when a short period for mixing has elapsed, the computer opens an overflow valve (which is closed during any plating or dosing). This causes any volume of bath in excess of the predetermined overflow level to be discarded, which keeps the tank from gradually overfilling. It should be noted that discarding a portion of a well mixed bath does not cause any change to the chemistry of the remaining solution and hence does not affect the material-balance equations. The computer then closes the overflow valve before any additional plating or dosing are performed.

Any equivalent hardware chosen to perform these tasks is within the scope of the invention.

The RDE monitor used for measuring $Fe^{2+}$ concentration in this embodiment is disclosed in IBM Technical Disclosure Bulletin Vol. 31, No. 1, June 1988. Any other equivalent apparatus or method (e.g. titration) could be used to measure the concentration of this species.

EXAMPLE 2: COPPER PLATING BATH

The specific example of the SEL-REX CUBATH M bath (SEX-REX and CUBATH are registered trademarks of OMI International Corporation) as used for fabricating conductor elements of electronic devices is described here. There are other similar copper plating baths generally available. The bath is aqueous and nominally contains 0.27M $CuSO_4$, 1.70M $H_2SO_4$, 2.0 mM HCl, 6.4 ml/l MD, and 1.6 ml/l M-Lo. As in Example 1, the measure of process service is the plating charge in Ampere-hours (A-hr).

MBRC FOR THE COPPER BATH

AFF for the Copper Bath

Categorization of Species (AFF Rule Number 1)

The deliberate species can be categorized as follows: $Cu^{2+}$=D-$P_G$; $H^+$=D-nonP, $SO_4^{2-}$=D-nonP; $HSO_4^-$=D-nonP; $Cl^-$=D-$P_G$; MD=D-$P_R$-T; and M-Lo=D-$P_R$-T. Principal non-deliberate species are products of reactions (both process-linked and time-linked) of the two additives MD and M-Lo. Some of these are thought to influence the electrodeposit quality.

Apparent Stoichiometry of the Process Reactions (AFF Rule Number 2)

The primary chemical reactions are the reduction of $Cu^{2+}$ to Cu at the cathode and the oxidation of Cu to $Cu_{2+}$ at the anode. Other reactions include the decomposition of the organic additives, both service and time linked.

The copper reduction and oxidation reactions usually balance to within one percent, so that $$|k_{Cu2+}|=0.01/nF=0.2 \text{ mmole/A-hr}$$

where n=2 equivalent/mole and F=26.7 A-hr/equivalent (Faraday's constant). Thus, $k_{Cu2+}$ is small in magnitude, whether positive or negative, and, since $Cu^{2+}$ is abundant in the bath, relative changes in $Cu^{2+}$ concentration are quite gradual. The coefficients $k_{SO42-}$, $k_{H+}$, and $k_{HSO4-}$ are zero for practical purposes. Because of slow consumption at the anode, $k_{Cl-}$ is usually negative and small in magnitude, i.e. less than 0.1 mmole/A-hr. The coefficients $k_{MD}$ and $k_{M-Lo}$ can only be expressed in millimeters of concentrate per Ampere-hour, since MD and M-Lo contain species of undisclosed identity and concentration. The supplier's recommended replenishment schedule for batch operation suggests the following values for the stoichiometric coefficients: $k_{MD}$ from 0.2 to 0.8 ml/A-hr and $k_{M-Lo}$ between 0.05 and 0.2 ml/A-hr. Strictly, MD and M-Lo should not be considered to be pure species because each contains more than one true chemical compound. However, no more rigorous treatment is possible since the components of each additive can neither be analyzed nor supplied individually.

Feed Stocks for Each D-P Species (AFF Rule Number 3)

The algorithm for advantageous feed formulation (AFF) leads to the following set of four feed solutions:
1. copper stock: 1.00M copper sulfate
2. chloride stock: 0.10M hydrochloric acid
3. MD stock: liquid concentrate supplied by vendor
4. M-Lo stock: liquid concentrate supplied by vendor High-concentration D-P Stocks (AFF Rule Number 4)

Copper Stock is made as 1.00M $CuSO_4$, near the solubility limit. The MD and M-Lo stocks are liquid concentrates supplied by the vendor company. Chloride Stock is made sufficiently dilute for practical constraints on the feed stock formulation for accurate metering with a standard pump. The inorganic stocks are formulated to be free of perishable organic additives.

Mass Balance on nonD-P Species (AFF Rule Number 5)

The rule requiring balancing of counterions was relaxed since $k_{Cu^{2+}}$ is very low and since the sulfate ion concentration is not critical.

Ability to Blend to Nominal Bath Composition (AFF Rule Number 6)

An additional feed, Acid Stock, is provided to satisfy this rule. This consists of 2.43M $H_2SO_4$. Notice that 1 liter of nominal bath can be composed by mixing 700 ml of Acid Stock, 270 ml of Copper Stock, 20.0 ml of Chloride Stock, 6.4 ml of MD Stock, and 1.6 ml of M-Lo Stock.

Pure Solvent Stock (AFF Rule Number 7)

Again, pure deionized water is dispensed with an additional metering pump. Thus the total number of feeds, including water, is six.

SPD for the Copper Bath

The standard scheme of stoichiometry-predicted dosing (SPD) is applied.

ABC and ABT for the Copper Bath

Since none of the inorganic species ($Cu^{2+}$, $Cl^-$, $H^+$, and $SO_4^{2-}$) drifts rapidly, off-line monitoring is usually adequate. Measurements can be made at service intervals ranging from 0.1 to 1 A-hr/l for $Cl^-$ and from 1 to 10 A-hr/l for $Cu^{2+}$, $H^+$, and $SO_4^{2-}$. If nontrivial deviations from target values are found, correction and tuning are implemented using the ABC and ABT equations presented under "Detailed Description of the Invention," above.

Since rigorous analytical methods are not available for the organic additives, analysis-based correction and tuning (ABC and ABT) are not applicable for these components, and the appropriate recourse is performance-based correction and tuning (PBC and PBT). A Hull cell can be used along with other visual observations of the plated workpieces to indicate when one of the additives has drifted outside its desired range of concentration. (This is common practice even when an additive is known to contain more than one active species, each drifting independently, and even when the desired concentration range is not known with any absolute units.) Empirical guidelines are followed to estimate how much of each additive should be added or temporarily withheld and what changes should be made to the coefficients $k_{MD}$ and $k_{M-Lo}$ in the stoichiometry-predicted dosing (SPD) scheme. As long as the SLVE and EPSD components of the SSBC method are followed, the compromised MBRC based on PBC and PBT rather than on ABC and ABT can produce most of the benefits of the uncompromised MBRC.

SEC for the Copper Bath

The same density-based scheme for dosing water into the bath is used as for the Permalloy Bath (Example 1).

SLVE FOR THE COPPER BATH

The value of K used for the SLVE scheme is normally chosen between 1 and 20 A-hr/l, depending on the desired steady-state age of the bath.

EPSD FOR THE COPPER BATH

In most applications, the pace of process service (used in the EPSD scheme) ranges from 2 to 200 A-hr/l-week, with 20 taken as a typical value. Under strict SSBC operation, this pace would be kept constant from day to day and week to week, with dummy plating used to compensate for any shortcoming in production throughput.

APPARATUS FOR THE COPPER BATH

The hardware for controlled automatic delivery of the feed solutions is of the same type as Example 1, with a computer, metering pumps, mixing reservoir, volume measurement, and overflow system. On-line chemical monitors can be used if available but are not required in the mode presently described.

What is claimed is:

1. A method for controlling the concentration of chemical species in a wet chemical bath which is chemically interacting with a workpiece, comprising the steps of:
    a. classifying the chemical species deliberately added to the bath as deliberate species;
    b. developing a material balance model by performing a material balance on each deliberate species using the stoichiometry of chemical reactions in the bath involving the deliberate species;
    c. using the material balance model to predict an amount of each deliberate species to add to the bath in order to keep each deliberate species in the bath near a target concentration; and
    d. replenishing the bath with the predicted amount of the deliberate species by using one or more feed stocks that are formulated in compliance with the material balance for the deliberate species where each feed stock is dosed into the wet chemical bath in a volume proportional to a process service delivered over a time period and where a constant of proportionality for dosing is determined by the material balance.

2. A method of controlling the concentrations of chemical species in a wet chemical bath as, in claim 1, where the feed stock solutions are formulated by a method further comprising the following steps:
    a. assigning each known species in the bath to one of the following categories: 1) solvent, 2) deliberate, rapid process-active, 3) deliberate, gradual process-active, 4) deliberate, non-process-active, 5) non-deliberate, process-active, or 6) non-deliberate, non-process-active;
    b. developing the overall stoichiometry of the system of process reactions in the bath including known reactions and an estimate of relative rates;

c. making a separate feed stock solution for each deliberate process-active species;

d. formulating the feed stock solutions with a deliberate process-active species concentration higher than the nominal concentration of this species in the bath; and e. formulating the feed stock solutions so that the concentration of any deliberate, non-process-active species in the bath remains unchanged when the bath is replenished with the feed stock solutions.

3. A method of controlling the concentrations of chemical species in a wet chemical bath, as in claim 2, further comprising a feed stock solution of pure bath solvent.

4. A method of controlling the concentrations of chemical species in a wet chemical bath, as in claim 1, further comprising the stoichiometry-predicted dosing of the bath with one or more feed stock solutions, where the feed stock solution is metered into the bath at a rate so that the overall bath material balance on all process-active species is maintained.

5. A method of controlling the concentrations of chemical species in a wet chemical bath, as in claim 1, which performs an analysis-based correction of a chemical species in the bath further comprising the steps of:

a. monitoring the bath to determine if a deliberate species concentration is off a target value;

b. calculating the amount of each deliberate species to add to the bath to bring each off-target deliberate species back to its target value without changing the concentration of the other deliberate species in the bath; and c. replenishing the bath with the calculated amounts of each deliberate species.

6. A method of controlling the concentration of chemical species in a chemical bath, as in claim 1, which tunes the apparent stoichiometric coefficients of the material balance model, further comprising the steps of:

a. bringing the bath to a condition where all the deliberate species in the bath are at a respective target concentration for each species;

b. recording the cumulative volume of each chemical feed stock solution which has been added to the bath since a last tuning; and c. recalculating new apparent stoichiometric coefficients using the recorded volume values and the material balance model.

7. A method of controlling the concentrations of chemical species in a wet chemical bath, as in claim 1, which provides a performance-based correction of the bath species concentration further comprising the steps of:

a. monitoring the performance of the bath on the workpiece to determine if the performance is different than an expected performance; and b. adding an estimated amount of a deliberate species to the bath to bring the bath performance to its expected level.

8. A method of controlling the concentration of chemical species in a wet chemical bath, as in claim 1, which provides a performance-based tuning of the material balance model coefficients further comprising the steps of:

a. monitoring the performance of the bath on the workpiece to determine if the performance is different than an expected performance; and b. changing the coefficients of the material balance model an estimated amount to prevent the bath performance from drifting.

9. A method of controlling the concentration of a chemical species in a wet chemical bath, as in claim 1, further comprising the steps of:

a. determining when and how much bath solvent needs to be added to the bath by monitoring a deliberate, non-process-active, non-time-active species for a concentration change; and b. adding the determined amount of bath solvent to the bath at the determined time.

10. A method of controlling the concentration of a chemical species in a wet chemical bath, as in claim 1, further comprising the steps of:

a. determining when and how much bath solvent needs to be added to the bath by monitoring the specific gravity of the bath; and b. adding the determined amount of bath solvent to the bath at the determined time.

11. A method, as in claim 1, for controlling the deliberate, non-time-active chemical species concentrations in a permalloy bath where the deliberate species are $Fe^{2+}$, $H^+$, $Ni^{2+}$, $Cl^-$, $SO_4^{2-}$, $Na^+$, boric acid, saccharin, and a surfactant.

12. A method, as in claim 11, which also maintains the permalloy bath concentration of non-deliberate, non-time-active species at a constant level by adding to the bath a total aggregate amount of replenishing solution in a given time period in proportion to an amount of plating charge passed in the time period.

13. A method, as in claim 12, which also maintains the concentration of time-active permalloy bath species constant by passing the same plating charge per unit bath volume in each given time period.

14. A method, as in claim 1, for controlling concentrations of chemical species in a copper plating bath where the deliberate species are $Cu^{2+}$, $H^+$, $SO_4^{2-}$, $Cl^-$, and two organic additives.

15. A method for controlling the concentrations of chemical species in a copper plating bath, as in claim 14, which also maintains the bath concentration of the non-deliberate, non-time-active species at a constant level by adding to the bath a total aggregate amount of replenishing solution in a given time period in proportion to the amount of process service the permalloy bath underwent in the time period.

16. A method for controlling the concentrations of chemical species in a copper plating bath, as in claim 15, which also maintains the concentration of time-active bath species constant by passing the same plating charge per unit bath volume in each given time period.

17. A method for maintaining the concentrations of one or more non-time-active species in a wet chemical bath at a constant level comprising the steps of:

a. replenishing the wet chemical bath with one or more replenishing volumes containing one or more deliberate species;

b. determining the aggregate volume of the replenishing volumes containing the deliberate species; and c. adding an additional volume of a solution that contains all the deliberate species of the wet chemical bath at their nominal concentrations so that the total of the additional volume and an aggregate volume of the replenishing volumes is proportional to an amount of process service delivered in a time period.

18. A method for maintaining the concentrations of all non-time-active species in a wet chemical bath at a constant level, as in claim 17, where the deliberate species are replenished using a method comprising the following steps:

developing a material balance model by performing a material balance on each of the deliberate species by using the stoichiometry of chemical reactions in the bath involving the deliberate species;

using the material balance model to predict an amount of each deliberate species to add to the bath in order to keep each deliberate species in the solution near a target concentration; and replenishing the bath with the predicted amount of the deliberate species by using one or more feed stocks that are formulated in compliance with the material balance for the deliberate species where the feed stock is dosed into the wet chemical bath in a volume proportional to a process service delivered over a time period and where a constant of proportionality for dosing is determined by the material balance.

19. A method, as in claim 18, which maintains a process service density at a preselected value.

20. A method, as in claim 19, which maintains the process service density at the point of optimum steady-state bath performance.

21. A method of maintaining the concentrations of one or more non-time-active species at a constant level, as in claim 12, where the species of the aggregate and additional volumes are combined together in one or more feed stocks.

22. A method for maintaining the concentrations of all deliberate and non-deliberate species in a wet chemical bath at a constant level comprising the steps of:
 a. replenishing the bath with one or more volumes containing one or more deliberate species;
 b. determining the aggregate volume of the replenishing volumes;
 c. adding an additional volume of a solution that contains all the deliberate species of the bath at their nominal concentrations so that the total of the additional volume and the aggregate volume is proportional to an amount of process service delivered in a time period, the time period being one of a plurality of equal time periods; and
 d. using the same amount of service density in the bath in each time period.

23. A method for maintaining the concentrations of all deliberate and non-deliberate species in a wet chemical bath at a constant level comprising the steps of:
 a. classifying the chemical species deliberately added to the bath as deliberate species;
 b. developing a material balance model by performing a material balance on each deliberate species using the stoichiometry of chemical reactions in the bath involving the deliberate species;
 c. using the material balance model to predict an amount of each deliberate species to add to the bath in order to keep each deliberate species in the bath near a target concentration;
 d. replenishing the bath with the predicted amount of the deliberate species by using one or more feed stocks that are formulated in compliance with the material balance for the deliberate species where each feed stock is dosed into the wet chemical bath in a volume proportional to a process service delivered over a time period and where a constant of proportionality for dosing is determined by the material balance;
 e. adding an additional volume of a solution that contains all the deliberate species of the wet chemical bath at their nominal concentrations so that the total of the additional volume and an aggregate volume of the replenishing volumes is proportional to an amount of process service delivered in a time period, the time period being one of a plurality of equal time periods; and
 f. passing the same amount of process service per unit bath volume through the bath during each time period.

* * * * *